United States Patent [19]

MacFadden et al.

[11] 4,238,729
[45] Dec. 9, 1980

[54] MAGNETIC DAMPING SYSTEM HAVING LOW INDUCTION MAGNET

[75] Inventors: John A. MacFadden; Joseph M. Keever, both of Raleigh, N.C.

[73] Assignee: Westinghouse Electric Corp., Pittsburgh, Pa.

[21] Appl. No.: 12,915

[22] Filed: Feb. 16, 1979

[51] Int. Cl.³ .................................................. G01R 1/16
[52] U.S. Cl. ...................................... 324/152; 324/137
[58] Field of Search ................................ 324/137, 152

[56] References Cited

U.S. PATENT DOCUMENTS

| | | |
|---|---|---|
| 817,305 | 4/1906 | Duncan . |
| 1,687,686 | 10/1928 | Paschen .................... 324/152 |
| 1,705,682 | 3/1929 | Reime . |
| 2,309,414 | 1/1943 | Nobbs ..................... 171/264 |
| 3,076,934 | 2/1963 | Witte et al. ............... 324/152 |
| 3,309,152 | 3/1967 | Ramsey, Jr. et al. .......... 308/10 |
| 3,688,192 | 8/1972 | Ramsey, Jr. ............... 324/137 |
| 4,030,031 | 6/1977 | Stucker .................... 324/152 |
| 4,182,984 | 1/1980 | MacFadden et al. .......... 324/152 |

FOREIGN PATENT DOCUMENTS 906404  9/1962  United Kingdom .

*Primary Examiner*—Michael J. Tokar
*Attorney, Agent, or Firm*—R. W. Smith

[57] ABSTRACT

A magnetic damping system for induction devices having electroconductive disk armatures includes a low induction, high coercive force magnet that is vertically elongated and has a horizontal direction of magnetization parallel to the disk. Flux concentrating pole pieces adjoin the magnet pole faces for vertically directing two closely spaced braking magnetic fields from a pair of pole tips and into the disk. A temperature compensating arrangement covers the sides of the permanent magnet between the edges of the pole pieces to efficiently compensate for higher reversible temperature coefficients of magnet remanence.

20 Claims, 8 Drawing Figures

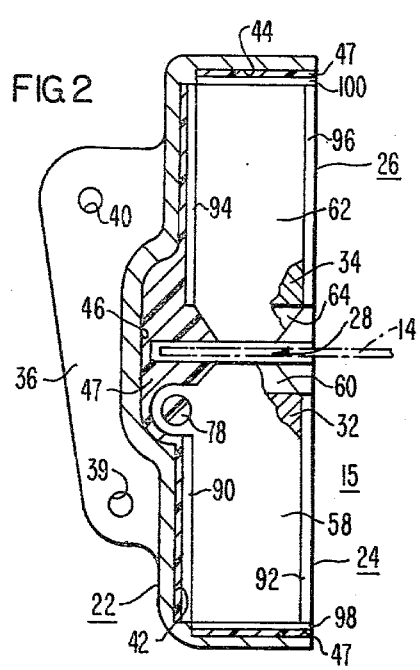
FIG. 2
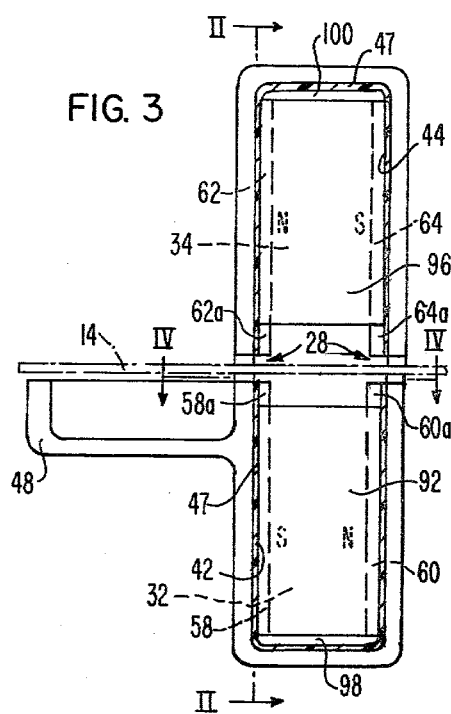
FIG. 3
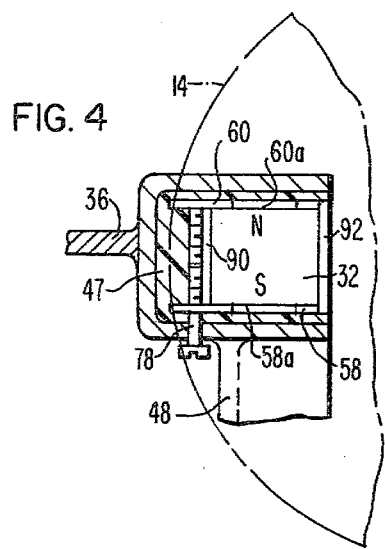
FIG. 4
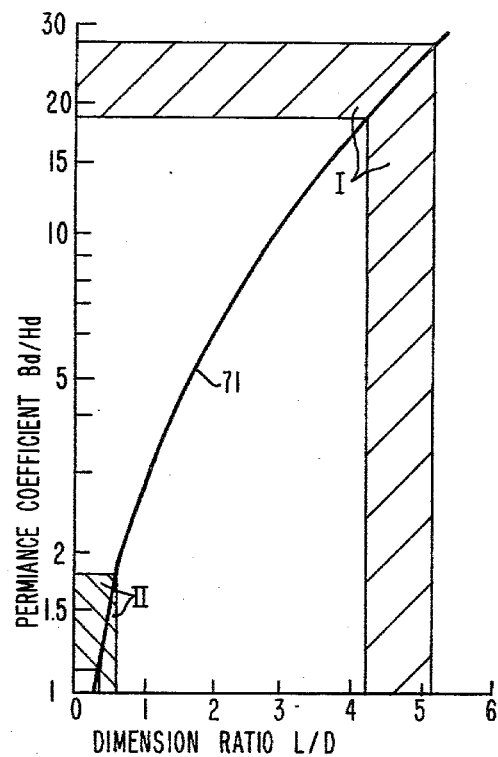

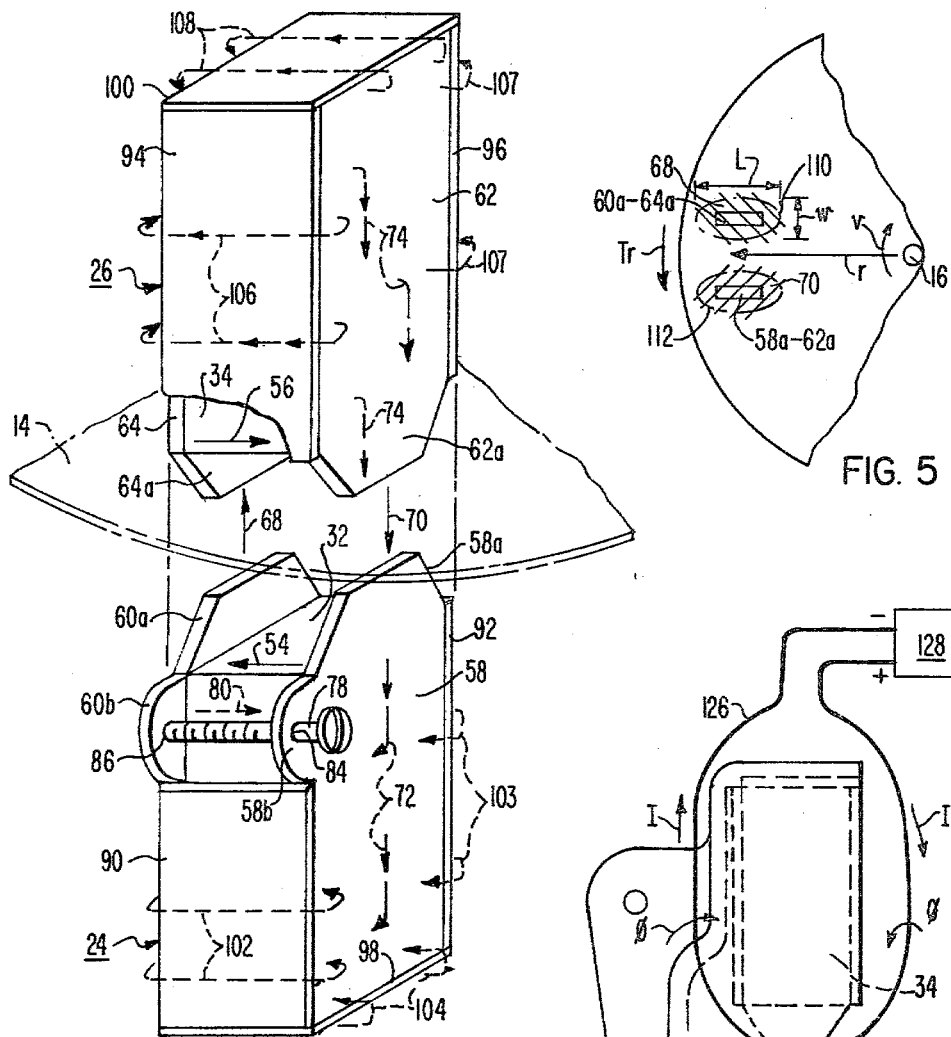
FIG. 5
FIG. 6
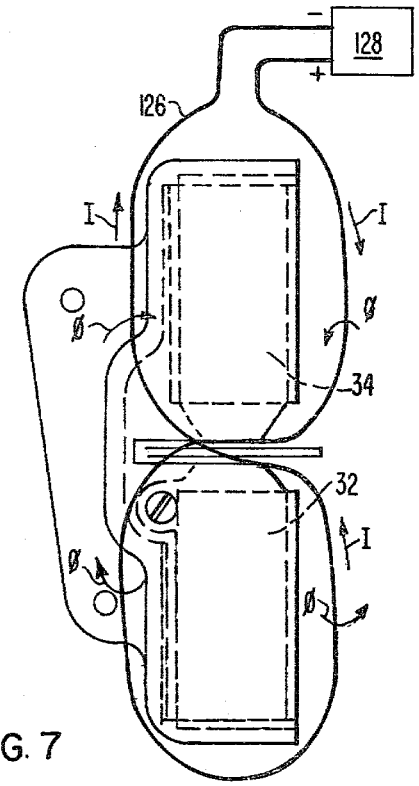
FIG. 7

MAGNETIC DAMPING SYSTEM HAVING LOW INDUCTION MAGNET

BACKGROUND OF THE INVENTION

1. Field of the Invention

This invention relates to a new and improved magnetic damping system for producing magnetic braking or retarding torque on a conductive disk of an induction device and more particularly to such a damping system including a low flux density permanent magnet having a pair of flux concentrating pole pieces for efficiently directing braking magnetic fields into the meter disk.

2. Description of the Prior Art

Magnetic braking or eddy current brake arrangements are commonly included in induction type meter and relay devices and in particular in induction electromechanical watthour meters. An electromagnetic unit having voltage and current sections are typically included in the induction watthour meters for connection between an electrical source and a load for measuring the consumption of AC electric energy. AC magnetic fields from the electromagnetic unit produce a driving torque on a rotatable armature formed by an electroconductive disk. Interaction between the changing magnetic fields and changing eddy currents induced in the disk by the fields develops a metering responsive driving torque on the disk. Associated with the measuring rotation of a watthour meter is a magnetic brake or damping system for directing a unidirectional or permanent magnet braking field into the disk which induces eddy currents. The braking magnetic field reacts with the eddy currents to produce a retarding torque on the disk. The retarding torque is proportional to the disk speed and balances the disk driving torque. The disk speed is maintained accurately proportional to the electric power applied through the meter so that each disk rotation is representative of a predetermined quantum of electric energy consumption.

The braking magnetic field of most modern watthour meters is provided by permanent magnets which direct magnetic fluxes through an air gap space receiving the meter disk. The strength and stability of the permanent magnets, the position of the braking magnetic field in relation to the disk center, the area, shape and flux density of the braking field entering the disk, and the length of the air gap spacing are all important factors in controlling and producing the retarding torque. It is essential that the retarding torque be kept proportionally constant for efficient and accurate meter operation over very long meter lifetimes, and while the meter operation is subject to widely varying temperature and atmospheric changes. Substantial mechanical shock and vibration can occur in shipping and handling and the meter is also subject to strong demagnetizing effects caused by electrical surges through the meter due to lightning and other causes.

The design of a magnetic damping system must incorporate the above and other factors and considerations including an assembly that is easily and simply manufactured at minimum cost in accordance with high volume production techniques. The system must have a size and configuration capable of being incorporated and mounted within the small space of a watthour meter available for such systems. The damping permanent magnets must be capable of being magnetized and demagnetized to establish predetermined levels of magnetization and induction while assembled in the system. Provision for calibration of the retarding torque must be further included and is referred to as full load adjustment in the watthour metering art. Temperature compensation is further required to compensate for reversible temperature-related changes in the remanence or magnetization of the damping permanent magnets and in the temperature dependent operating characteristics of the meter electromagnet unit producing the disk driving torque, referred to as Class 1 temperature errors in the watthour metering art.

Since permanent magnets form the principal element of a damping system, the magnetic characteristics of the permanent magnets principally control the system design configuration required to produce the desired eddy current brake and disk retarding torque. It is generally desirable to utilize a permanent magnet having highly anisotropic, high energy, high magnetic flux density and high coercive magnetic characteristics. Also desirable are relatively high temperature and life-time stability characteristics, availability in useful and compact shapes and sizes, and further having costs within commercially acceptable amounts consistent with total manufacturing cost.

In general, permanent magnetic materials are characterized as "hard" magnetic materials since they are difficult to magnetize; but once they are magnetized, they remain in the state of magnetization due to having a high coercivity or coercive force (Hc) characteristic. The residual flux density or induction (Br) and remanence characteristic of permanent magnet materials produce the operating flux density (Bd) in the magnet and externally at the magnet ends. An air gap flux density (Bg) and total magnetic field strength in the air gap of an eddy current brake gap is then dependent upon the magnet characteristics.

One extensively and commercially used C-shaped damping permanent magnet for one type of watthour meter is described and claimed in U.S. Pat. Nos. 3,309,152 and 3,076,934, both assigned to the assignee of this invention. Another commercially used magnetic damping assembly for another type of watthour meter has a pair of bar damping magnets spaced apart to form an air gap wherein a meter disk rotates as described in U.S. Pat. No. 3,688,192, also assigned to the assignee of this invention. The meter magnetic damping systems of the aforementioned patents utilize permanent magnets of a commercially available Alnico 5 and Alnico 8 permanent magnet materials having suitable high strength or high density magnetic flux with relatively high coercive force magnetic characteristics. In U.S. Pat. application Ser. No. 903,324 filed May 5, 1978 and assigned to the assignee of this invention, a magnetic damping system for watthour meters is described and claimed using a pair of compact and substantially flat permanent magnets which are opposingly spaced to form an eddy current brake air gap. The permanent magnets are made of a more recently developed cobalt-rare earth permanent magnet material having high energy, high coercivity and residual induction, and highly anisotropic characteristics. In U.S. Pat. No. 4,030,031 a meter magnetic damping system is also disclosed using a pair of spaced, compact and substantially flat permanent magnets also made of a cobalt-rare earth permanent magnet material.

Many permanent magnet materials and compositions including those described for the meter magnet magnetic damping systems in the aforementioned application and patents, include critical chemical elements in their chemical compositions which are becoming or are expected to become increasingly scarce or substantially more costly so that their use becomes increasingly unattractive or unavailable. At least two such potentially critical chemical elements are cobalt and nickel which are used in the Alnico, rare earth and other permanent magnet materials included in moderate to high energy permanent magnets having high residual flux densities. Alternatively, most of the other available permanent magnets not including critical chemical elements in their chemical compositions also do not have the high strength and flux density, high coercivity, stability or suitable physical characteristics including volume or shape required for magnetic damping. When it is desired to utilize a permanent magnet, not including one of the critical elements, which provide one or more of the enhanced magnetic characteristics, the damping system design must achieve the most efficient use of and compensation for one or more of the deficient magnetic characteristics of the alternative permanent magnets which may be more available or have substantially lower or more desirable costs.

Many permanent magnets are limited to certain shapes and geometrical configurations by the magnet energy-product characteristics and the physical and chemical material characteristics, including those contemplated for use with the present invention. Many magnets are made with powder metallurgical techniques incorporating use of high pressures and temperatures in sintering and bonding processes so that they are normally available only in regular straight-line bar, block or slab shapes and sizes. Conversely, the C-shaped permanent magnet of the aforementioned U.S. Pat. Nos. 3,309,152 and 3,076,934 is made by a casting or molding technique used in Alnico 5 magnets. In the other of the aforementioned patents and in U.S. Pat. No. 1,705,682, vertically magnetized slab or short block and horizontally elongated and magnetized bar permanent magnets are disclosed. As so far as is known, the magnets of most damping systems of modern induction devices including watthour meters include materials having at least one critical element such as cobalt.

U.S. Pat. No. 817,305 discloses an older type magnetic damping system including a large U-shaped permanent magnet made of one of older low energy type magnet materials. The system includes a soft magnetic strap circumscribing the magnet to increase efficiency by capturing and utilizing excess stray or leakage magnetic fields, characteristic of early magnets having low anisotropy, and applying them to opposing pole tips forming a damping air gap. U.S. Pat. No. 2,309,414 discloses a pair of short block permanent magnets in a meter magnetic damping system both disposed vertically and on one side of a disk air gap. The permanent magnets are disposed in oppositely poled relationships and include a soft magnetic yoke extending from the outer magnetic pole faces to the other side of the air gap. British Pat. No. 906,404 discloses a pair of horizontally disposed bar damping permanent magnets that are long and have small cross sections. Each magnet has opposite curved or bent soft magnetic pole pieces. The horizontally magnetized and elongated magnets have magnetic fluxes that are bent and directed through more than a ninety degree arc by the pole pieces through a high flux leakage path and across a vertical air gap including a meter disk. The high flux leakage is offset by the resultant closely spaced braking magnetic fields that are intended to avoid error producing interference with the AC metering fields.

The aforementioned patents also include disclosures of various Class 1 temperature-compensating arrangements usually disposed along the side of the magnets and these are not highly efficient for high anisotropic magnets. The aforementioned patents also disclose various full-load adjusting features and arrangements which often include a screw-type adjuster for varying permeance in leakage or flux return paths of the damping system.

SUMMARY OF THE INVENTION

In accordance with the present invention, an improved magnetic damping system for induction devices having conductive disk armatures includes a low flux density permanent magnet formed by compositions not having critical chemical elements which are or may be scarce or excessively costly. The lower induction permanent magnet is further generally characterized as having good anisotropic and coercive force characteristics, moderate maximum energy products with higher reversible temperature coefficient or higher remanence variation with temperature change but otherwise highly stable when compared to a conventional and general class of damping permanent magnets such as including Alnico magnet materials. The low induction permanent magnet has a short horizontal direction of magnetization and has a vertically elongated height to define an upright block shape. In short length, in the direction of magnetization, is small relative to a large cross sectional magnet area at right angles to the length. Thus, the magnet material has permeance coefficients and L/D dimension ratios substantially lower than the Alnico magnets so as to operate at low values of flux density.

The opposite and vertically disposed magnet pole faces or ends are covered by adjoining flat isotropic soft magnetic pole pieces acting as flux concentrators. The horizontal cross section of the flux concentrating pieces is narrow and they terminate at pole tips extending below the permanent magnet and adjacent the meter disk. The flux concentrating pole pieces concentrate and focus the relatively low flux densities of the magnet external magnetic fluxes while substantially reducing flux leakage so as to efficiently direct the magnet fluxes to the pole tips. Flux from the pole tips provides two closely spaced and efficiently shaped localized and high density braking magnetic fields passing into the conductive disk. Highly effective eddy current brake operation produces the desired disk retarding torques. In a preferred embodiment, the pole tips are tapered to further concentrate and localize the braking magnetic fields in a predetermined shape elongated along a radius of the disk. Thus, highest retarding torque is achieved with the available braking field strengths.

Since the inherent properties of a magnetic material determine its optimum shape for maximum energy use, especially the effective length-to-diameter dimension ratio (L/D), the flux concentrating pole pieces in the system of this invention make the maximum use of the optimum shapes of low flux density, high coercive magnet materials for producing high air gap flux density and concentrated eddy current paths required for efficient damping. Low flux density permanent magnets, such as those made of ceramic magnet materials, are used in conjunction with soft steel flux concentrating pole pieces of this invention to provide the high flux concentration (or density) necessary to retard a meter eddy current disk. The pole pieces collect the low density flux distributed over large pole face areas of the magnet and densify it so that high density flux is emitted from the pole tips adjacent to the air gap.

Magnetic temperature compensation is provided by flat or strip temperature compensator parts covering, in parallel relationship, both sides of the permanent magnet. The parts extend between aligned pairs of side edges of the magnet pole pieces extending along the elongated vertical corners of the magnet pole faces. Thus, the temperature compensator parts are most efficiently positioned for magnetically coupling to the isotropic high flux source provided at the pole pieces for shunting the pole face fluxes when the magnet remanence varies inversely with temperature. The disk retarding torque performance is maintained substantially constant with changes in temperature. A further temperature compensator part extends over the outer permanent magnet surface and between the pair of top edges of the pole pieces for further compensation. The temperature compensator parts can be separate and have different dimensions or different negative temperature coefficients of permeability to afford more flexibility in adjustments for providing desired temperature compensation.

A full load adjustment feature of the magnetic damping system includes mutually aligned ears or integral side extensions of the flux concentrating pole pieces. One of the extensions, preferably of the forward flux concentrating pole piece, threadably receives a screw made of a soft magnetic material so as to be movable relative to the other extension. The screw adjustably varies the magnetic flux shunted between the magnet poles so it bypasses the pole tips and air gap.

It is a general feature of the present invention to provide a magnetic damping system having a permanent magnet assembly efficiently utilizing the characteristics of highly coercive and lower flux density permanent magnets having a short length in a horizontal direction of magnetization and an elongated upright height so as to have a relatively large magnet cross section and large pole face area. A pair of flux concentrating flat pole pieces adjoin the vertical magnet pole faces and terminate at pole tips providing closely spaced oppositely directed high flux density braking magnetic fields directed in substantially non-interfering relationship into an air gap and into a conductive disk armature to effect a highly effective eddy current brake operation. Another feature of this invention is to provide the damping assembly with temperature compensator parts extending along the magnet for temperature variable magnetic coupling of the flux concentrating pole pieces. A still further feature of the invention is to provide a full load adjustment feature integral with the flux concentrating pole pieces for shunting the magnet pole face fluxes. A still further feature of the invention is to provide a damping system having a pair of the magnet assemblies opposingly aligned so that the pole piece tips define an eddy current air gap with the pair of magnet assemblies being easily and readily manufactured by utilizing simple components and being capable of relatively simple assembly and mounting to an electromagnet unit of an induction meter device when carried in a nonmagnetic housing detachably mounted to the frame of the device. The housing arrangement allows the permanent magnets to be easily magnetizable when the magnet assemblies are in the housing and to be demagnetizable to a calibrated magnetization when the entire damping system is mounted in a meter device.

Other novel features and advantages of the present invention will become apparent from the detailed description hereinbelow of the drawings briefly described hereinafter.

BRIEF DESCRIPTION OF THE DRAWINGS

FIG. 2 is a front cross-sectional view, with parts broken away, taken along the axis II—II in FIG. 3 and looking in the direction of the arrows;

FIG. 3 is a side elevational view of the damping system shown in FIG. 1 separate from the meter device;

FIG. 4 is a top cross-sectional view taken along the axis IV—IV in FIG. 2 looking in the direction of the arrows;

FIG. 5 is a diagrammatic view for purposes of illustrating the orientation of braking magnetic fields produced in a disk armature by the damping system shown in FIG. 1;

FIG. 6 is a side perspective view of two permanent magnet assemblies separated from the magnet damping assembly shown in FIG. 1 for purposes of illustrating the principles of operation of the damping system;

FIG. 7 is a graph of the relationship between dimension ratios (L/D) and permeance coefficients (Bd/Hd) of bar or straight block magnets;

FIG. 9 is a schematic view of one manner of demagnetizing the magnets shown in FIG. 8 to calibrated values.

DETAILED DESCRIPTION OF THE PREFERRED EMBODIMENT

Figure 1:
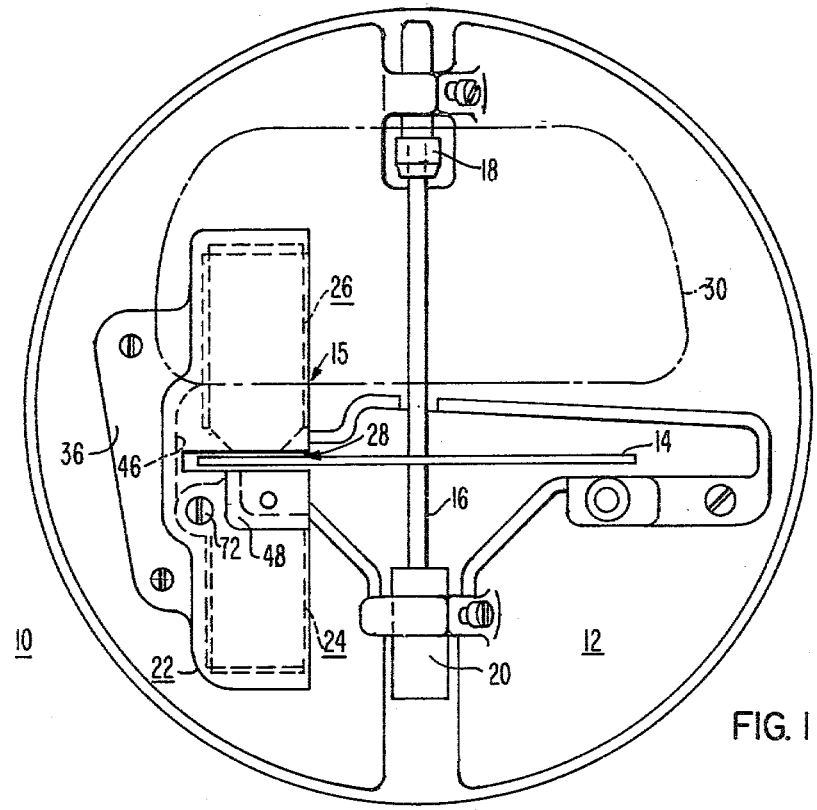
FIG. 1 is a front elevational view with parts broken away of an induction watthour meter device including a magnetic damping system made in accordance with the present invention.

Referring now to the drawings and more particularly to FIG. 1, there is shown an induction device formed by an induction watthour meter 10 including a frame 12 made of a nonmagnetic die-cast material such as aluminum supporting the different parts of the meter movement. The meter 10 is generally of a type having different meter parts shown and described in the aforementioned U.S. Pat. No. 3,309,152 and incorporated herein by reference. The aforementioned patent may be referred to for more detailed description of the general features of one exemplary type of induction device including a magnetic damping system, generally designated by the numeral 15, made in accordance with the present invention.

The meter 10 is briefly described hereinafter for a better understanding of the present invention. A rotatable induction armature is formed by an electroconductive disk 14 carried on a vertical shaft 16 supported by a magnetic bearing assembly. Upper and lower bearing supports 18 and 20 are carried by the frame 12 as disclosed in U.S. Pat. Nos. 3,143,704; 3,413,550; 3,693,086 and 3,810,683, all assigned to the assignee of this invention. An electromagnet unit, not shown, is described in the aforementioned U.S. Pat. No. 3,309,152, and it includes a voltage section having a voltage winding and a current section including a pair of current coils for connection between an electric source and electric load for which the consumption of electric energy is to be measured. The voltage and current sections produce AC driving magnetic fields across a metering air gap of the electromagnet unit and into the disk 14. A disk driving torque (Td) is produced on the disk 14 by the interaction of eddy currents induced therein with the voltage and current responsive magnetic fields which induce the eddy currents as is well-understood in the watthour metering air including the meter 10.

The magnetic damping system 15 of this invention includes a detachable housing 22 mounted to the meter frame 12 extending above and below the disk 14. A pair of permanent magnet assemblies, including a first and lower magnet assembly 24 and a second and upper permanent magnet assembly 26, are carried in mutually vertical alignment in the housing 22. The magnet assemblies 24 and 26 direct two close, opposite, unidirectional and substantially constant braking magnetic fields, described further hereinbelow, across an eddy current brake air gap 28 wherein the disc 14 rotates. The braking magnetic fields induce eddy currents in the disk 14 and disk retarding torques (Td) are produced by an eddy current brake operation which opposes the disk driving torques produced by the AC voltage and current metering magnetic fields. The retarding magnetic torques, produced by the system 15, partially counterbalance the driving magnetic torques so that the rate of rotation of the disk 14 and shaft 16 is proportional to Td minus Tr and the AC electric power applied through the meter. Each rotation of the disk is proportional to a predetermined quantum of electrical energy consumption to be measured by the meter 10. A dial register, an outline which is shown by broken lines 30, is disclosed in the aforementioned U.S. Pat. No. 3,309,152 for totalizing the rotations of the shaft 16 to provide dial readings indicating kilowatthours of electric energy consumption in accordance with the operation of such registers known in the watthour metering art.

The magnetic damping system 15 is shown separated from the meter 10 in FIGS. 2, 3 and 4. A perspective view of the separate lower and upper permanent magnet assemblies 24 and 26 is illustrated in FIG. 6 to more clearly show the physical and magnetic operative relationships of the magnet assemblies 24 and 26 with respect to each other and the disk 14. The system 15 effects a desired eddy current brake operation by permanent magnets 32 and 34 in the assemblies 24 and 26, respectively, by use of magnets having generally high coercive force (Hc) and lower residual flux density (Br) characteristics as described in further detail hereinbelow.

As shown in FIG. 2, the detachable housing 22, includes a one piece part made of a nonmagnetic material such as aluminum having a mounting flange 36 for attaching the damping system 15 to the meter frame 12. A suitable fastening means such as screws 38, shown in FIG. 1, are applied to the flange holes 39 and 40 for threading attachment to the frame 12. Vertically elongated rectangular chambers 42 and 44 are formed in the housing 22 below and above the disk 14 when the housing 22 is assembled to the meter 10. The lower chamber 40 receives the magnet assembly 24 and the upper chamber 44 receives the magnet assembly 26 and each chamber includes three U-shaped sides, as more clearly seen in FIG. 4, and closed outer ends terminating the top and bottom portions of the housing 22. A middle portion of the flange 36 includes a recessed portion 46 partially receiving the outer circumference of the disk 14. The assemblies 24 and 26 are secured to the housing 22 by a material 47 which may include a hardenable resin such as epoxy or a low-melting temperature metallic alloy which is nonmagnetic such as disclosed in the aforementioned U.S. Pat. No. 3,076,934.

The housing 22 further includes a forward-projecting boss portion 48 which terminates at a forward end substantially parallel to a forward-projecting boss 50 formed in the frame 22, shown in FIG. 1. Holes in the bosses 48 and 50 receive screws not shown, for mounting a lower nameplate, also not shown, to the meter frame 12. The housing 22 is mounted to the face of the frame 12 so that the magnet assemblies 24 and 26 define the eddy current brake air gap 28 at a outer radial part of the disk 14 with the magnet assemblies 24 and 26 being disposed and aligned in a symmetrical radial relationship with respect to the center of the disk 14 as explained further hereinbelow in connection with the description of FIG. 5.

Each of the magnet assemblies 24 and 26 include, as the principle part and element thereof, one of the permanent magnets 32 and 34, respectively. The magnets are substantially identical and are mutually aligned in symmetrical relationship with respect to each other and the disk 14. The permanent magnets are selected from a group of permanent magnets which do not require a presently critical element in the chemical composition of its permanent magnet alloy or material. Such materials include ferrite or ceramic magnet materials described further hereinbelow. The available alternative permanent magnets, not including cobalt, for example, generally have a lower flux density than the presently used permanent magnets in meter damping systems. Most higher flux density and high energy product permanent magnet alloys and materials include at least one critical element such as cobalt or nickel. The most commonly used commercial magnet alloys and materials for damping magnets of modern watthour meters include magnets made from the Alnico group or class of magnet materials. For example, the commercial forms of the meters described in the aforementioned U.S. Pat. Nos. 3,076,934; 3,309,152; and 3,688,192 use Alnico 5 and Alnico 8 magnets. The Alnico compositions include approximately 14 to 20% nickel and 24 to 38% cobalt with both elements potentially increasing in scarcity and cost. The classes and groups of magnet materials referred to herein are the same as included in the Standard Specifications For Permanent Magnet Materials published by the Magnetic Materials Producers Association, Evanston, Ill. 60202.

The magnetic induction or flux density magnet characteristic is a primary consideration since this provides the available magnetic flux field strength to produce the required braking magnetic field in the eddy current air gap 28. The physical size and shape of the permanent magnets are important since the cross sectional area times the flux density determines the total magnetic flux available from the magnets; however, the shapes are made in accordance with the maximum energy magnetic characteristics and manufacturing processes required to form the magnets from different compositions. In turn, the magnet shape determines the magnet performance characteristics.

One general class of permanent magnet alloys and materials contemplated for the permanent magnets of the present invention includes the ceramic magnet materials. The chemical composition of ceramic magnetic materials includes oxides of barium, strontium and lead, and a ferric oxide having a general composition of MO.6fe$_2$O$_3$ where M is chosen from the aforementioned metals including barium, strontium and lead. These ceramic magnets are marketed under various trade names including Magnadure, Ferroxdure, Indox, Cromag, Ferrimag and Ceramag. The raw materials used in the manufacture of the ceramic magnets are considered substantially low-cost and are readily available and obtainable. These magnets have physical properties similar to ceramics and are usually brittle and usually do not have the capability of being machined. They are manufactured by powdered metallurgy processes including the application of high pressures and heat to attain sintering temperatures. Often the powder materials are subjected to strong magnetic fields as pressure is applied to provide the desired oriented and anisotropic magnetic characteristics. The magnets are usually formed in a die and have generally straight-line configurations with opposite parallel surfaces. The ceramic magnets, although lower in flux density, have moderate maximum energy products and generally good to high anisotropic directional characteristics and coercive characteristics. They also have a low physical density and high electric resistivity and high resistance to demagnetization. The good anisotropic and coercivity characteristics are important features in meter magnetic damping systems. The stability characteristics of ceramic magnets are generally good, having low edging and deterioration effects and good dimensional stability. Ceramic magnets have a somewhat higher reversible temperature coefficient of remanence in the temperature ranges typically specified for watthour meters than do Alnico magnet materials. Representative magnetic characteristics for Alnico materials designated Alnico 5 and Alnico 8 are: residual induction (Br), in kilogauss, 12.8 and 8.2; coercive force (Hc), in oersteds, 640 and 1650; and maximum energy product (HdBd) max., in megagauss-oersteds, 5.5 and 5.3; while the characteristics of ceramic magnet materials designated Ceramic 1 and Ceramic 8 are: (Br), in kilogauss, 2.3 and 3.85; (Hc), in oersteds, 1800 and 2950; and (HdBd) max., in megagaussoersteds, 1.0 and 3.5.

The permanent magnets 32 and 34 are made of a ceramic magnet material and have a short stubby rectangular block shape with a short length in the direction of magnetization and a vertically extended upright height with large cross sectional area as shown more clearly in FIG. 6. The directions of magnetization of the magnets 32 and 34 are horizontal and parallel to the disk 14. The directional arrows 54 and 56 in FIG. 6 indicate the directions of magnetization along the lengths thereof. Thus, the front and back pole ends of the magnets 32 and 34 define vertically elongated south S and north N and north N and south S, respectively, magnet pole faces. The front pole ends of the magnets 32 and 34 as, viewed in FIGS. 1 and 2, have S and N polarities, respectively.

The height and width, which is the distance across the magnet ends, provides a cross sectional area that is large relative to the length. The magnets 32 and 34 are characterized as having a small length to diameter (L/D) dimension ratio noted further below. The large pole face areas are equal to the cross sectional area defined by the magnet height and width dimensions and provide a high total magnetic flux although the flux density is relatively low. In one preferred form the magnets are a Ceramic 8 material available either as Index 8 from Indiana General Corp. or S-8 from Stackpole Carbon Co. The dimensions in one preferred form of the magnets 32 and 34 are length 0.4 inch (1.02 cm), height 1.15 inch (2.9 cm) and width 0.5 inch (1.3 cm).

An important feature of the invention is a flux concentrating pole-piece arrangement associated with each of the pole faces of the magnets 32 and 34. A first pair and a second pair of substantially identical flux concentrating pole pieces 58 and 60 and 62 and 64, respectively, are provided. The flux concentrating pole pieces are made of a flat or slab-like soft magnetic material such as cold rolled steel having isotropic and high permeability characteristics. The thicknesses of the pole pieces is in the order of 0.1 inch (0.25 cm). The pole pieces 62 and 64 are identical and pole pieces 58 and 60 are identical to each other and substantially identical to the pole pieces 62 and 64 except for extensions provided for full load adjustment. The width of the pole pieces 62 and 64 are 0.58 inch (1.47 cm) and the length is 1.315 inch (3.34 cm). The flux concentrating pole pieces cover and adjoin the substantially straight and parallel magnet pole faces between the outer surfaces and the inner surfaces thereof.

Pole-tip areas 58a, 60a, 62a and 64a, of the associated pole pieces 58, 60, 62 and 64, respectively, extend beyond the inner surfaces of the magnets toward each other and the disk 14. The pole tips are tapered and the ends of each of the associated pairs of flux concentrating pole pieces are substantially parallel so as to terminate in mutually aligned relationships. The length of the pole tips from the ends of the straight sides is 0.135 inch (0.34 cm) and the width is 0.310 inch (0.79 cm) at the inner or tip end. The two gap spaces between the facing ends of the pole piece tips of each magnet assembly defines the air gap 28 wherein the braking magnetic fields are produced in a predetermined shape. While the gap 28 is referred to herein in the singular, it is to be understood to include the double air gap type as described for this invention including the two gaps between the pairs of facing pole tips. The directional arrows 68 and 70 in FIG. 6 and shaded areas in FIG. 5 represent the oppositely unidirectionally directed braking magnetic fields provided by the magnet assemblies 24 and 26 in the air gap 28 receiving the disk 14. In magnet systems generally, the magnetic flux density in an air gap therein is often represented by the symbol Bg. As used herein, Bg is intended to be the flux density of either of the braking magnet fields indicated by the numerals 68 and 70.

To further illustrate the differences in the operating characteristics of the low flux density and high coercive ceramic magnet material used in the present invention relative to the Alnico group or class of magnet materials, reference is made to the graph of the coefficients of permeance Bd/Hd and the L/D dimension ratios typically defined by curve 71 in FIG. 7. In fixed air gap magnet systems, such as the system 15, the system operation is designed to be at the maximum or peak energy product (BdHd) max. so as to make the most efficient use of the magnetic characteristics and require the least volume of magnet material. The operating point (Bd and Hd) on the magnet's demagnetization curve, not shown, but being the second quadrant of the hysteresis or B-H curve of the magnet, is selected to correspond to be close to the peak energy product value. The most energy efficient operating points are usually near the "knee" of the magnet's demagnetization curve. A line from the Bd and Hd operating point to the origin of the magnet's demagnetization curve has a slope referred to as the Bd/Hd permeance coefficient or the shear-line slope shown in the vertical graph axis in FIG. 7. The shape of the magnet, as noted above, is defined by the L/D dimension ratio and is shown in the horizontal graph axis in FIG. 7. The higher magnetic induction characteristics of Alnico magnets, noted above, require long slender magnets with higher L/D dimension ratios. As is known, D is the diameter of an equivalent area of a circular cross section magnet and is determined by the formula $D = 1.128 \sqrt{A}$ where A is the equivalent cross section area of a non-circular or straight bar or block magnet such as magnets 32 and 34. The shaded area I of the graph of FIG. 7 generally includes the characteristics of the Alnico magnet materials. Alnico 5 magnets typically have permeance coefficients (Bd/Hd) in a range of 18 to 27 and L/D ratios of 4 to 5.3. A representative L/D ratio for a "C" shaped watthour meter Alnico damping magnet is 5.5. In comparison, the lower induction and higher coercive ceramic magnetic materials operate at lower induction (Bd) points on their demagnetization curves and have a stubby or short length and large cross section volume shape and have lower L/D dimension ratios. The shaded area II of the graph of FIG. 7 includes the characteristics for Ceramic 8 magnet material. The permeance coefficients Bd/Hd are approximately between one and two and the L/D ratios are less than one and approximately 0.4 to 0.6 for Ceramic 8 magnets. One shape of the permanent magnets 32 and 34 used in the present invention and made of the Ceramic 8 material has a L/D dimension ratio of approximately 0.47 to have low induction but operating at a somewhat higher coercive force (Hd) operating point than do most Alnico magnets.

The flux concentrating pole pieces collect the flux lines from the associated magnet poles and concentrate the low density magnet flux fields, as indicated by the directional arrows 72 and 74 for two magnet poles in FIG. 6, flow in the flux concentrating pole pieces 58 and 62, respectively. The horizontally directed magnet fluxes at the low flux densities at the magnet pole faces are concentrated and intensified along the narrow cross sections of the pole pieces. The fluxes are directed vertically as external braking flux fields, indicated by directional arrows 70 and 68, into and from the air gap 28 and through the disk 14. The tapered shapes of the pole tips further concentrate, focus and shape the two closely spaced damping magnetic fields so they produce a high air gap flux density Bg. Thus, elongated and oblate braking magnetic fields pass through the disk 14 and developed correspondingly shaped eddy current paths as the disk 14 rotates through the air gap flux lines to produce the eddy current brake operation. It is noted that the shape of the magnetic fields 68 and 70 are elongated in a generally radial direction in the disk as shown in the shaded areas of FIG. 5. It is an important feature in the present invention to provide improved effectiveness of the eddy current damping operation by the air gap flux shape produced by the novel arrangement of the damping system 15 as is explained still further hereinbelow.

For compensating and calibrating the magnetic assemblies 24 and 26 in a particular meter arrangement, both full load adjustment and Class 1 temperature compensation features are provided in the damping system 15. Full load adjustment is provided by a linearly movable member formed by a calibration screw 78, shown in FIGS. 4 and 6, made of a soft magnetic iron or steel material as shown in the lower magnet assembly 24.

Ear-like integral extensions 58b and 60b of the flux concentrating pole pieces 58 and 60, respectively, are cooperatively arranged with each other and the screw 78 to provide a highly permeable path for shunting the magnet magnetic flux between the magnet pole faces as indicated by the directional arrow 80 in FIG. 6. The ear extension 68b L has a threaded opening 84 threadably receiving the shank of screw 78. The ear extension 60b has a hole 86 capable of receiving the shank end of the screw 78. The head of the screw 78 is slotted and is directed toward the front of the meter as shown in FIG. 1. The adjustable spacing of the shank end of the screw 78 relative to the rear flux concentrating pole-piece extension 60b and hole 86 thereof determines the amount of flux which is shunted by being passed along the path indicated by the directional arrow 80. Thus, flux from the N pole of the permanent magnet 32 is diverted from the pole tip 60a and the air gap 28 in a direct flux return path through the screw 78 to the extension 58b and the pole piece 58 and into the associated S pole.

The full load adjustment screw 78 is highly effective when used with the extensions 58b and 60b, however, without the extensions, the screw 78 is substantially less effective. This is due to the highly oriented and anisotropic magnetic characteristic of the ceramic magnet material. The pole pieces capture the highly directional magnet fluxes and couple these high magnetomotive force fluxes at the extensions 58b and 60b and to the screw.

The temperature compensating arrangements of the magnet assemblies 24 and 26 include pairs of temperature compensator parts 90 and 92 in assembly 24 and parts 94 and 96 in assembly 26. A side or edge view of such parts are shown in FIG. 2 and a perspective view of such parts are shown in FIG. 6. Further compensator parts 98 and 100 extend across the outer surfaces of the magnets 32 and 34, respectively, in a manner similar to that in which the parts 90, 92, 94 and 96 extend across the sides of the permanent magnets. The compensator parts are formed of a thin or strip magnetic material having a negative temperature coefficient of permeability such as provided by known temperature compensating magnetic materials having a predetermined nickel-iron content. The pair of parts 94 and 96 are substantially rectangular and extend over and between the two pairs of substantially coplanar side edges of the pair of pole pieces 62 and 64. The pole piece edges extend along the height corners of the magnet poles. The compensator parts 90 and 92 are similarly shaped and extend over and between the pairs of coaligned side edges of the pole pieces 58 and 60 except that the compensator part 90 is shortened at the inner end thereof to accommodate the ear extensions 58b and 60b. The compensator parts 98 and 100 extend in covering relationship over the magnet's outer surfaces and over the outer edges of the pairs of pole pieces 58 and 60 and 62 and 64, respectively, and over the outer ends of the pairs of compensator parts 90 and 92 and 94 and 96, respectively. The widths of the pole pieces are slightly greater than the widths of the magnet pole faces so that the compensator parts are spaced slightly from the magnet surfaces.

The positions of the temperature compensator parts provide maximum efficiency for shunting the magnet pole face flux fields with changes in temperature to compensate for changes in remanence of the permanent magnets with temperature variations. A substantially constant or calibrated value of braking magnetic field strength is maintained for accurate watthour meter performance over wide ambient temperature changes. The compensator parts are more effective because they are directly coupled and supplied with the higher density flux source provided at the side edges of the flux concentrating pole pieces which bend the magnet pole fluxes for easy flux entry into the compensator parts. This is especially important since the magnets 32 and 34 are highly anisotropic.

The directional arrows 102, 103 and 104 of FIG. 6 represent the flux shunting paths through the compensator parts 90, 92 and 98, respectively, of the assembly 24. The directional arrows 106, 107 and 108 represent the shunt paths through the compensator paths 94, 96 and 100, respectively, of the assembly 26. The temperature compensating magnetic paths directly couple the pole face fluxes between each pair of mutually aligned side edges and outer edges of the flux concentrating pole pieces of each magnet assembly. As is well understood by those skilled in the art, the permeability of the temperature compensator parts is higher at lower temperatures and lower at higher temperatures since the reversible temperature coefficient of magnetization or remanence of the permanent magnets results in decreasing magnetic strength and flux density with increasing temperatures. The ceramic magnet materials have a reversible temperature coefficient in the order of 0.1 while Alnico 5 magnet materials have a reversible temperature coefficient of about 0.01 which is far superior to the ceramic materials. The greater reversible temperature coefficient is one of the significant reasons that the ceramic magnets heretofor have not been generally considered practical for watthour meter damping systems.

Thus, it is a further important feature of this invention to provide a highly effective and efficient temperature compensating arrangement as provided by the compensator parts of the damping system 15 as described hereinabove. For optimum performance the high magnetomotive forces (oersteds) of the pole piece flux densities is directly fed to the compensator parts which have a substantially higher permeability than air but a very low permeability relative to that of the soft magnetic material of the pole pieces.

The temperature compensator parts of a single assembly may be varied with respect to each other in thickness, width or in the use of different compensating materials having different temperature coefficients of permeability to provide flexibility in obtaining the desired and calibrated amounts of temperature compensation. For example, the outer compensator parts 98 and 100 can include a 29% nickel-iron composition while the parts 90, 92, 94 and 96 can include a 33% nickel-iron composition. The thickness of parts 98 and 100 may be in the order of 0.025 to 0.036 inch (0.064 to 0.091 cm) while the thickness of parts 90, 92, 94 and 96 may be in the order of 0.046 inch (0.116 cm) in one preferred embodiment.

The highly effective operation of the magnetic damping system 15 using the lower strength or lower flux density permanent magnets, as described hereinabove, is due to the optimum performance of the magnets 32 and 34 in the described cooperative relationship with the associated parts of each of the magnet assemblies 24 and 26. The operation is further described referring to the diagrammatic view of FIG. 5 illustrating the important physical relationships represented by the generally accepted mathematical expression for eddy current brake operation as applied to the system 15. The eddy current braking torque equation is defined hereinafter for a single air gap and braking field such as 68 or 70 so the total torque on the disk 14 is doubled due to the double air gap 28 of the system 15.

$$Tr = K1 l^2 Bg^2 vrwt/p$$

$$Rd = p/wt$$

$$Td = K2 l^2 Bg^2 vr/Rd$$

Where:
Tr = disk retarding or eddy-current braking torque
l = length of braking magnetic field in the radial direction
Bg = flux density in the disk air gap 28 due one of the magnetic fields 68 or 70
v = linear velocity of the disk 14 through the braking magnetic field
r = effective torque radius
w = width of braking magnetic field perpendicular to radius
t = thickness of induction disk 14
$p$ = resistivity of the conductive material of the induction disk 14
Rd = effective resistance of either eddy current path 110 or 112 in disk 14
K1 & K2 = constants of proportionally depending on units of measurement and other empirical relationships The braking magnet fields 68 and 70 are shown in shaded areas of FIG. 5 as produced by the action of the components of the system including the two magnets, flux concentrating pole pieces, temperature compensator parts, and the full load adjusting means. The flux fields have an oblated ring shape fringing slightly from the upper pole tips 62d and 64a as they pass through the disk 14 but narrowing as they are conducted by the lower pole tips 58a and 60a. Eddy current paths 110 and 112 are induced in the disk by its rotation through the flux lines of the air gap. The spacing of the pole tips produces substantially non-interference between the two fields 68 and 70 and associated eddy currents.

The flux density term Bg of the above equation is provided by either of the two braking magnetic fields 68 and 70. The narrow cross section of the flux concentrating pole pieces and the pole tips provides concentration of the magnetic flux densities of the magnet pole face fluxes which is important since the retarding torque Tr is increased as a squared function of the Bg air gap flux density term. The flux density in the pole pieces is limited by magnetic saturation level of the soft magnetic material, which is soft iron or low coercive isotropic material such as low carbon steel, and the smallest dimensions thereof. The saturation level is usually in the order of 13,000 to 16,000 gauss for the aforementioned materials which provides efficient magnetic damping. Similarly, the field elongating and focusing effects of the pole piece pole tips increases the magnetic field length term l along a generally radial direction of the disk. Thus, the retarding torque Tr is also increased as a squared function of the l length term.

The shape, sizes, spacings, direction of magnetizations and relative mounting relationships of the permanent magnets 32 and 34 accommodate ease of applying magnetizing fields to the permanent magnets and applying demagnetization thereof to calibrate the magnet strengths.

Figure 8:
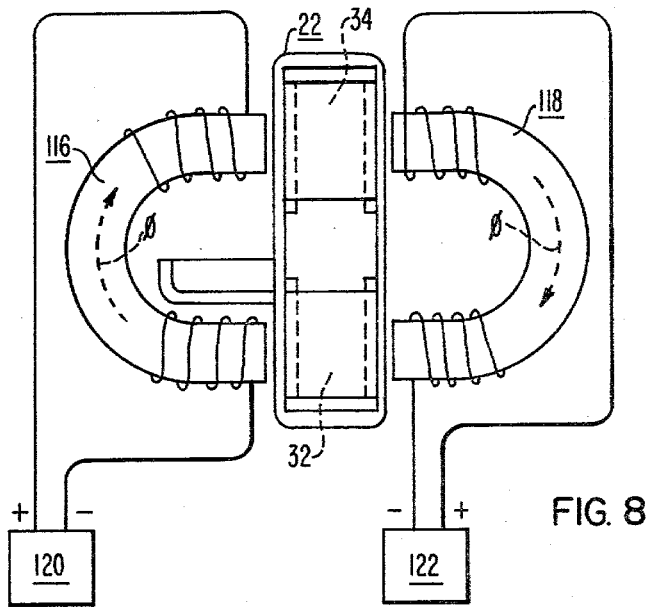
FIG. 8 is a schematic view illustrating one manner of magnetizing the magnets of the damping system of this invention.

FIG. 8 shows schematically how the magnetic damping system 15 enables ease of charging or initially magnetizing both magnets 32 and 34 when they are assembled in the housing 22 and separate from the meter 10 during manufacture. FIG. 9 shows schematically an easy manner of demagnetizing the magnets to calibrated values after the system 15 is assembled to the meter 10. In production, magnetization is typically done after the magnets and flux concentrating pole pieces are assembled as a system but before installation on the meter as in FIG. 8. Two U-shaped double coil magnetizers 116 and 118 are energized from DC sources 120 and 122 having the indicated polarities. The coils are arranged to produce magnetomotive forces such that the magnets are oppositely polarized as required for establishing the indicated polarities of the magnets 32 and 34.

In final stages of production, demagnetization can be accomplished with the damping system is installed on the meter and in the normal operating mode by placing a figure-eight shaped coil 126 energized from DC source 128 around the magnets as illustrated in FIG. 9. This unique arrangement enables each loop of the coil to generate magnetomotive force or field $\phi$ that is opposite in direction to the field of the other loop and thereby demagnetize the pair of magnets having opposite flux directions. Demagnetization adjusts for variations in magnetic strength due to production tolerances. In addition, demagnetization improves surge resistance as an additional benefit. However, the use of highly coercive ceramic magnets improves the system's resistance to demagnetization due to power line surges passing through the meter 10 even without the magnet calibrated demagnetization or knock-down as required for other magnets, such as those made of Alnico materials.

The configuration and arrangement of the magnetic damping system 15 of this invention provides unique utilizations of a selected low flux density magnet material. The magnet, as a high coercive, low flux density type with a small optimum L/D ratio, has its external field concentrated into a high density flux canalized through a pair of pole pieces and across a narrow fixed air gap to intersect an eddy current disk. The damping system efficiently uses ceramic magnet materials and produces the high flux density required for the braking magnetic fields while compensating for large reversible temperature coefficients thereof. The system configuration also minimizes external flux leakage and the consequent interference effects on the disk driving electromagnet and magnet bearing performance.

Accordingly, a new and improved magnet damping system 15 is provided in accordance with the above description of this invention. However, it is contemplated that changes and modifications may be made to the embodiment described above without departing from the spirit and scope of this invention as understood by those skilled in this art. Such alternatives and modifications may include but are not limited to use of a single magnet assembly, such as assembly 24 and replacing the assembly 26 with a soft magnetic block to return of the braking magnetic fluxes from the opposite side of the disk 14. Alternatively, the permanent magnet assemblies 24 and 26 can be mounted in a pair of cavities formed integrally in the meter frame 12 rather than in the detachable housing 22. Also, both of the assemblies 24 and 26 may include a full load adjustment feature as described for the magnet assembly 24 or optimally equivalent thereto or the upper pole pieces 62 and 64 may have the same extensions corresponding to extensions 58b and 60b provided on pieces 58 and 60, with or without holes, to minimize the number of standard parts. The three temperature compensator parts of each magnet assembly alternatively can include a single U-shaped compensator part, or it may be found possible to use fewer than three compensator parts such as not requiring or using the outer compensator parts 98 and 100, although best performance with the materials and parts described above has included the use of three of the compensator parts as described for each magnet assembly.

What is claimed is:

1. A magnetic damping system for an induction device magnetically driving an electroconductive disk, said magnetic damping system comprising:
    an elongated upright permanent magnet means having a direction of magnetization parallel to said disk and along a short length thereof extending between opposite magnet pole faces each having an upright height substantially greater than said length;
    flux concentrating pole piece means formed of a soft magnetic material adjoining said opposite pole faces and having edge portions extending along the height thereof and terminating at pole tip portions passing a pair of closely spaced and flux density concentrated braking magnetic fields into said disk; and
    temperature compensating magnetic means having a negative temperature coefficient of permeability and magnetically coupling coaligned pairs of said edge portions of said pole piece means to form compensating magnetic shunt paths between said opposite pole faces.

2. The magnetic damping system as claimed in claim 1 wherein said permanent magnet means includes a lower flux density and higher coercive force magnet material with the shape of said permanent magnet means having a dimension ratio (L/D) less than 1.

3. The magnetic damping system as claimed in claim 1 wherein said pole tip portions of said flux concentrating pole piece means extend in parallel relationship with each other and below an inner surface of said permanent magnet means so as to terminate adjacent said disk to define a eddy current brake air gap space.

4. The magnetic damping system as claimed in claim 3 wherein said pole tip portions of said flux concentrating pole piece means pass said braking magnetic fields into said disk so as to have elongated magnetic field configurations in a substantially radial direction of said disk.

5. The magnetic damping system as claimed in claim 4 wherein said permanent magnet means includes a substantially rectangular short block configuration and wherein said flux concentrating pole piece means includes a pair of thin soft steel members having a narrow cross section with said edge portions thereof extending along the outer and side corners of said opposite magnet pole faces with said pole tip portions extending along inwardly tapered side edge portions below the inner corners of said pole faces.

6. The magnetic damping system as claimed in claim 5 wherein said permanent magnet means is formed of a highly anisotropic oriented ceramic magnet material.

7. The magnetic damping system as claimed in claim 1 including a movably mounted soft magnetic member extending between integral portions of said flux concentrating pole piece means wherein each of said integral portions is associated with a different magnet pole face so that adjusting movement of said soft magnetic member varies the amount of the magnetic field shunted between the opposite magnet pole faces.

8. The magnetic damping system as claimed in claim 7 wherein said integral portions of said pole piece means include mutually aligned side extensions thereof and said soft magnetic member includes a threaded screw part threadably mounted in a threaded opening of one of said side extensions so that the end of the said screw is movable relative to the other of said side extensions.

9. The magnetic damping system as claimed in claim 1 wherein said temperature compensating magnetic means includes a pair of compensator parts formed of a flat magnetic temperature-compensating material extending over opposite sides of said permanent magnet means along the length thereof and adjoining the mutually aligned ones of two opposite pairs of said side edge portions of said pole piece means.

10. The magnetic damping system as claimed in claim 9 wherein said temperature compensating magnetic means includes a further compensator part formed of a flat magnetc temperature compensating material extending over an outer surface of said permanent magnet means along the short length thereof and adjoining a further and outer pair of mutually aligned ones of said side edge portions of said pole piece means.

11. The magnet damping system as claimed in claim 10 wherein at least one of said pairs of compensator parts and said further compensator part has a different magnetic temperature compensating characteristic than that of the remaining compensator parts.

12. The magnetic damping system as claimed in claim 11 wherein the at least one temperature compensator part is formed of a flat strip material having a negative temperature coefficient of permeability different from the negative temperature coefficient of permeability of a flat strip material forming one of the remaining compensator parts.

13. The magnetic damping system as claimed in claim 11 wherein the at least one temperature compensator part is formed of a flat material having a predetermined thickness different than a predetermined thickness of the flat material forming the one of the remaining temperature compensator parts so that the different thickness dimension of the at least one compensator part provides the predetermined different magnetic temperature compensating characteristic thereof.

14. A magnetic damping system for an induction meter device having an electroconductive disk armature rotatable at a rate proportional to a quantity to be measured, said magnetic damping system comprising:

first and second permanent magnet assemblies mounted on opposite sides of said electroconductive disk;

first and second substantially identical permanent magnets included in said first and second assemblies, respectively, each of said first and second permanent magnets having a vertically elongated rectangular block configuration with a direction of magnetization parallel to a short length thereof and to said electroconductive disk so that opposite pole faces thereof have a substantially longer height extending substantially vertically of an outer edge of said electroconductive disk;

first and second pairs of flat flux concentrating pole piece members made of a soft magnetic material included in said first and second assemblies, respectively, each of said pairs of pole piece members covering one of said opposite pole faces of an associated permanent magnet in an adjoining and closely magnetically coupled relationship, and each of said pole piece members terminating at a pole tip portion focusing the associated pole face magnetic field into a predetermined disk receiving air gap space and aligned with a pole tip portion of a oppositely magnetically poled pole piece member of the other permanent magnet assembly, such that a pair of oppositely unidirectional high flux density braking magnetic fields are each directed into said electroconductive disk in a predetermined pattern substantially elongated along a disk radius; and first and second temperature compensating magnetic means included in said first and second permanent magnet assemblies, respectively, each of said first and second temperature compensating magnetic means including a magnetic material having a negative temperature coefficient of permeability covering in an adjacent relationship the sides of an associated permanent magnet and extending between the opposite pole faces thereof, and further covering in an adjoining and closely magnetically coupled relationship the aligned sides of an associated pair of pole piece members for variably shunting the pole face magnetic fields in an inverse relationship to changes in temperature.

15. The damping system as claimed in claim 14 wherein said first and second magnetic temperature compensating means each include a pair of compensator parts covering the mutually opposite sides of an associated permanent magnet and a third compensator part covering the outer surface of the associated permanent magnet with all of the compensator parts extending between the opposite pole faces of the associated permanent magnet.

16. The damping system as claimed in claim 15 wherein at least one of said first and second pairs of flux concentrating pole piece members include mutually aligned side extensions, and wherein a linearly adjustable soft magnetic member is movably mounted for varying the magnetic coupling between the mutually aligned side extensions correspondingly adjusting the intensity of said braking magnetic fields.

17. The damping magnet system as claimed in claim 14 wherein said first and second permanent magnets are made of a ceramic permanent magnet material.

18. The magnetic damping system as claimed in claim 17 wherein said ceramic permanent magnet material includes a chemical composition including barium oxide and ferric oxide.

19. The magnetic damping system as claimed in claim 16 including a detachable nonmagnetic housing having a pair of chambers receiving and carrying said first and second permanent magnet assemblies so that one of said flux concentrating pole piece members of each of said permanent magnet assemblies faces the front of said meter, and said housing further includes a mounting flange for securing the magnet assemblies to said meter and over both sides of said electroconductive disk.

20. The magnetic damping system as claimed in claim 19 wherein said linearly adjustable soft magnetic member includes a screw having a threaded shank portion extending between said side extensions of the associated flux concentrating pole piece members and a head portion exposed to the front of said induction meter device.

* * * * *